United States Patent
Chang et al.

(10) Patent No.: US 10,504,572 B2
(45) Date of Patent: *Dec. 10, 2019

(54) METHODS FOR ADDRESSING HIGH CAPACITY SDRAM-LIKE MEMORY WITHOUT INCREASING PIN COST

(71) Applicant: SAMSUNG ELECTRONICS CO., LTD., Suwon-si, Gyeonggi-do (KR)

(72) Inventors: Mu-Tien Chang, Santa Clara, CA (US); Dimin Niu, Sunnyvale, CA (US); Hongzhong Zheng, Los Gatos, CA (US); Sun Young Lim, Gyeonggi-Do (KR); Indong Kim, Kyunggi-Do (KR); Jangseok Choi, San Jose, CA (US)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/811,576

(22) Filed: Nov. 13, 2017

(65) Prior Publication Data
US 2018/0102152 A1 Apr. 12, 2018

Related U.S. Application Data

(63) Continuation of application No. 15/227,911, filed on Aug. 3, 2016, now Pat. No. 9,837,135.

(Continued)

(51) Int. Cl.
*G11C 8/08* (2006.01)
*G11C 13/00* (2006.01)
(Continued)

(52) U.S. Cl.
CPC .............. *G11C 8/08* (2013.01); *G11C 7/1018* (2013.01); *G11C 8/04* (2013.01); *G11C 8/06* (2013.01);
(Continued)

(58) Field of Classification Search
CPC ............ G11C 13/0004; G11C 13/0026; G11C 13/0028; G11C 8/08
(Continued)

(56) References Cited

U.S. PATENT DOCUMENTS 6,108,745 A * 8/2000 Gupta ................. G06F 12/0215
711/127
6,493,814 B2 * 12/2002 Fields, Jr. ........... G06F 12/0811
711/117

(Continued)

FOREIGN PATENT DOCUMENTS

| CN | 101809668 A | 8/2010 |
| CN | 105027213 A | 11/2015 |

OTHER PUBLICATIONS

Wang; Modern DRAM Memory Systems: Performance Analysis and Scheduling Algorithm; Dissertation submitted to the Faculty of the Graduate School of the University of Maryland, Directed by Department of Electrical and Computer Engineering, and Institute for Advanced Computer Studies, © 2005, 246 sheets.

(Continued)

*Primary Examiner* — Vu A Le
(74) *Attorney, Agent, or Firm* — Lewis Roca Rothgerber Christie LLP

(57) ABSTRACT

A method for addressing memory device data arranged in rows and columns indexed by a first number of row address bits and a second number of column address bits, and addressed by a row command specifying a third number of row address bits followed by a column command specifying a fourth number of column address bits, the first number being greater than the third number or the second number being greater than the fourth number, includes: splitting the first number of row address bits into first and second subsets, and specifying the first subset in the row command and the second subset in a next address command when the first (Continued)

number is greater than the third number; otherwise splitting the second number of column address bits into third and fourth subsets, and specifying the fourth subset in the column command and the third subset in a previous address command.

20 Claims, 11 Drawing Sheets

Related U.S. Application Data

(60) Provisional application No. 62/303,353, filed on Mar. 3, 2016, provisional application No. 62/347,569, filed on Jun. 8, 2016.

(51) Int. Cl.
*G11C 8/04* (2006.01)
*G11C 8/06* (2006.01)
*G11C 8/18* (2006.01)
*G11C 7/10* (2006.01)
*G11C 8/12* (2006.01)

(52) U.S. Cl.
CPC .............. *G11C 8/12* (2013.01); *G11C 8/18* (2013.01); *G11C 13/0026* (2013.01); *G11C 13/0028* (2013.01); *G11C 13/0069* (2013.01)

(58) Field of Classification Search
USPC .......................................................... 365/163
See application file for complete search history.

(56) References Cited

U.S. PATENT DOCUMENTS

| 7,093,059 | B2 | 8/2006 | Christenson |
| 7,936,639 | B2 | 5/2011 | Ba et al. |
| 8,130,576 | B2 | 3/2012 | Bains et al. |
| 9,030,899 | B2 | 5/2015 | Lee |
| 9,104,646 | B2 | 8/2015 | Zheng et al. |
| 9,183,920 | B2 | 11/2015 | Ware et al. |
| 9,251,874 | B2 | 2/2016 | Nale |
| 2016/0019139 | A1 | 1/2016 | Alam et al. |
| 2016/0019161 | A1 | 1/2016 | Patel et al. |

OTHER PUBLICATIONS

Wang, Jue, et al.; Building and Optimizing MRAM-Based Commodity Memories, ACM Transactions on Architecture and Code Optimization, vol. 11, No. 4, Article 36, publication date Dec. 2014, 22 pages.

* cited by examiner

| Function | | | | |
|---|---|---|---|---|
| Extended READ | 1st clock | H | H | CKE Previous Cycle |
| | 2nd clock | H | H | CKE Current Cycle |
| | | H | H | ACT_n |
| | | H | L | RAS_n / A16 |
| | | L | H | CAS_n / A15 |
| | | H | H | WE_n / A14 |
| | | L | | BG0 - BG1 | BG |
| | | L | | BA0 - BA1 | BA |
| | | L | H | C2 |
| | | L | V | C0-C1 |
| | | | | BC_n / A12 |
| | | RFU | EA | A17 |
| | | | | A13 |
| | | Priority | | A11 |
| | | | X | A10 / AP |
| | | | | A9 - A7 |
| | | RID | CA | A6 - A0 |

| Function | 1st clock | | | | | | | | | | | | | | | | | |
|---|---|---|---|---|---|---|---|---|---|---|---|---|---|---|---|---|---|---|
| | CKE Previous Cycle | CKE Current Cycle | ACT_n | RAS_n/A16 | CAS_n/A15 | WE_n/A14 | BG0-BG1 | BA0-BA1 | C2 | C0-C1 | BC_n/A12 | A17 | A13 | A11 | A10/AP | A9-A7 | A6-A0 |
| | | | | H | L | L | BG | BA | H | V | | EA | | | L | | CA |
| Extended WRITE | H | H | H | H | L | L | BG0-BG1 | BA0-BA1 | C2 | C0-C1 | BC_n/A12 | A17 | A13 | A11 | A10/AP | A9-A7 | A6-A0 |

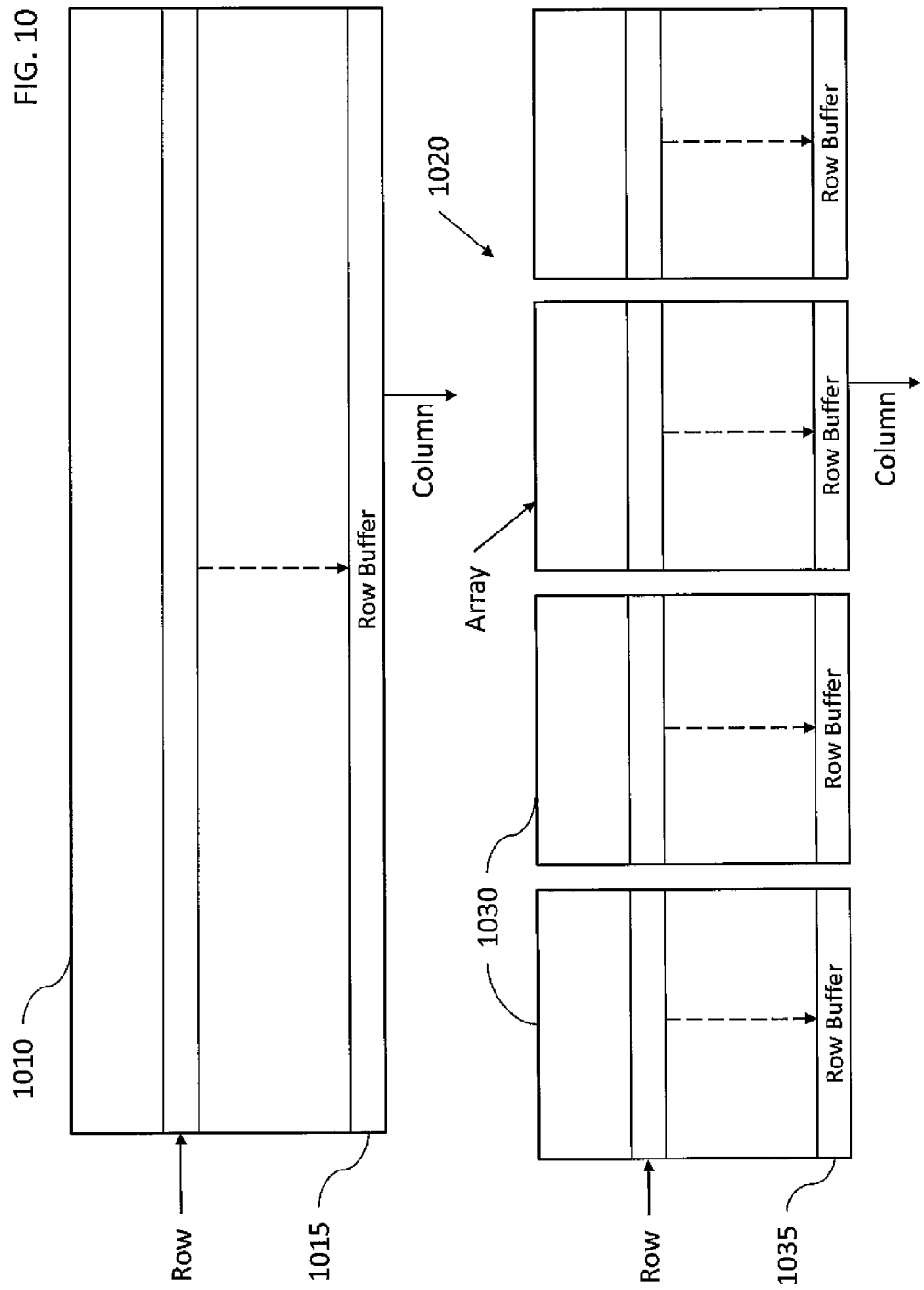

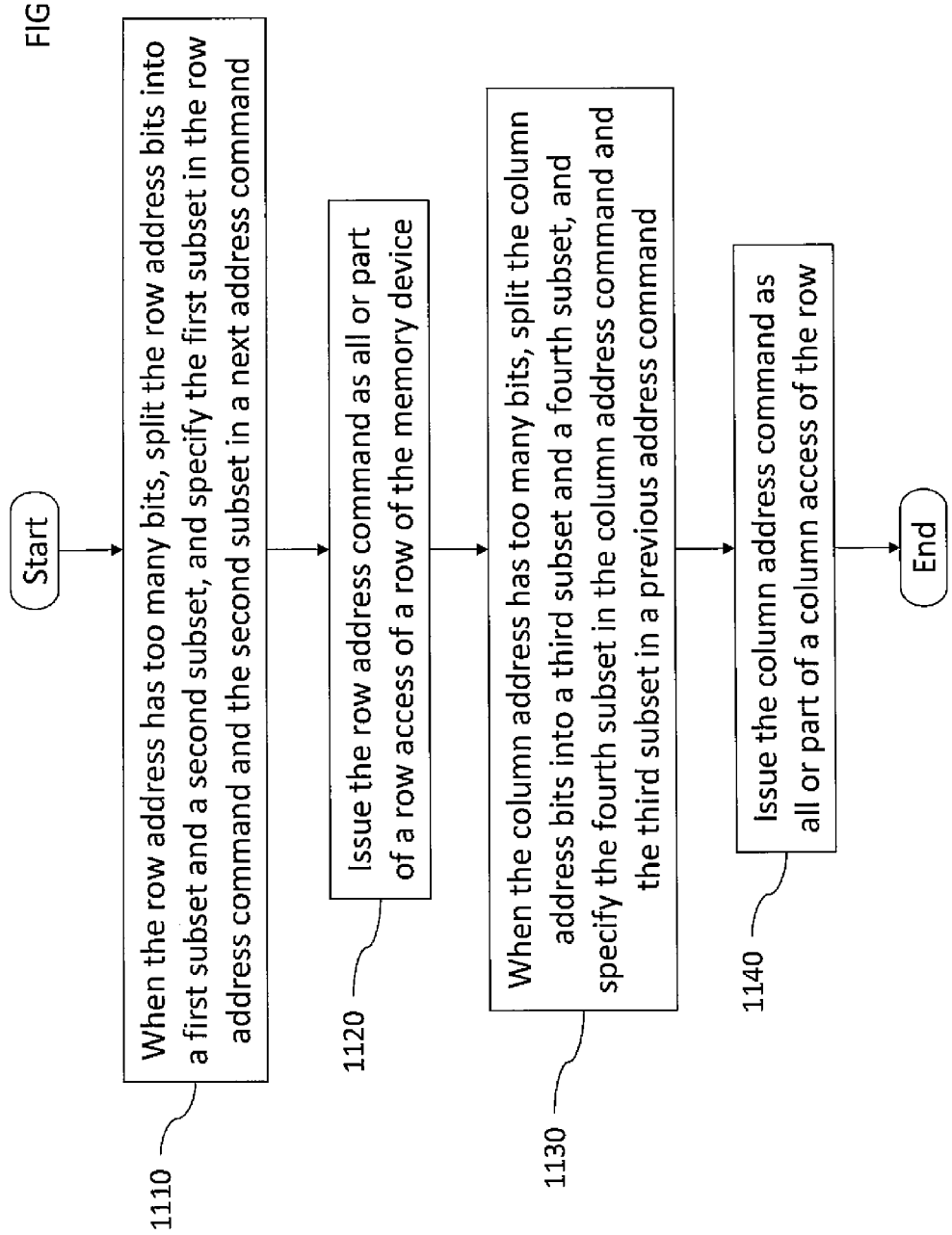

METHODS FOR ADDRESSING HIGH CAPACITY SDRAM-LIKE MEMORY WITHOUT INCREASING PIN COST

CROSS-REFERENCE TO RELATED APPLICATION(S)

This application is a Continuation application of U.S. application Ser. No. 15/227,911, filed on Aug. 3, 2016, which claims priority to and the benefit of U.S. Provisional Application No. 62/303,353, filed on Mar. 3, 2016 and Provisional Application No. 62/347,569, filed on Jun. 8, 2016; the entire contents of which are incorporated herein by reference.

BACKGROUND

1. Field

Aspects of embodiments of the present invention are directed toward methods for addressing high capacity SDRAM-like memory without increasing pin cost or pin count.

2. Description of Related Art

In the JEDEC DDR4 SDRAM (double data rate fourth-generation synchronous dynamic random-access memory) standard, there are 3 pins for CID (chip ID, or rank), 4 pins for bank, and 18 (shared) pins for row or column (depending on command). The current pin usage and addressing scheme supports up to 256 GB per DIMM (dual inline memory module, a collection of numerous DRAM chips or other memory chips in a single package) assuming the precise combination of DRAM chip sizes, widths, and organization is selected and assembled (otherwise, a lower-capacity or lower-addressable DIMM results). Module capacity or addressability larger than that is not supported (e.g., the memory would not be addressable even if it could be physically added to the module).

SUMMARY

Aspects of embodiments of the present invention are directed toward SDRAM command, timing, and organization. By way of example, aspects of the present invention are directed to systems and methods for addressing high capacity SDRAM-like memory without increasing pin cost or pin count. Further aspects are directed towards supporting high capacity memory modules, yet retaining SDRAM-like (e.g., DDR4) address pin definitions. Still further aspects are directed toward ACT+ (Activate command) or RD/WR+ (Read/Write command) extensions. Yet still further aspects are directed toward back-to-back RAS/CAS (row address strobe/column address strobe) commands, back-to-back CAS/CAS, and timing modifications. Yet further aspects are directed toward multi-row or multi-column buffer organizations, including command modifications and device reorganizations.

According to an embodiment of the present invention, a method for addressing data in a memory device is provided. The data is arranged in an array of rows and columns respectively indexed by a first number of row address bits and a second number of column address bits. The data is addressed using an architecture defined by a row address command specifying a third number of row address bits followed by a column address command specifying a fourth number of column address bits. The first number is greater than the third number or the second number is greater than the fourth number. The method includes: splitting the first number of row address bits into a first subset of row address bits and a second subset of row address bits, and specifying the first subset in the row address command and the second subset in a next address command when the first number is greater than the third number; issuing the row address command as all or part of a row access of a row of the memory device; splitting the second number of column address bits into a third subset of column address bits and a fourth subset of column address bits, and specifying the fourth subset in the column address command and the third subset in a previous address command when the second number is greater than the fourth number; and issuing the column address command as all or part of a column access of the row.

The next address command may be the column address command or the previous address command may be the row address command.

The issuing of the column address command may immediately follow the issuing of the row address command.

The first number may be greater than the third number. The architecture may be further defined by a first access time representing a delay between the column address command and availability of the data on a data bus. The method may further include: performing an initial column access of the row in a second access time, the second access time being longer than the first access time; and performing a subsequent column access of the row in the first access time.

The method may further include issuing the next address command or the previous address command after the row address command and before the column address command.

The issuing of the next address command may immediately follow the issuing of the row address command or the issuing of the previous address command may immediately precede the issuing of the column address command.

The method may further include splitting the second number of column address bits into the third subset of column address bits and the fourth subset of column address bits, and specifying the fourth subset in the column address command and the third subset in the previous address command when the first number is greater than the third number.

The first number may be greater than the third number. The data may be further arranged in subarrays of the rows and columns, each of the subarrays being a subset of the rows and columns and respectively indexed by the third number of row address bits and the second number of column address bits. The first subset of row address bits may be the third number of row address bits. The memory device may include a row buffer for each of the subarrays. The method may further include, for each subarray of the subarrays, loading a corresponding said row buffer with row data from the subarray as specified by a corresponding said first subset of row address bits in response to the row address command.

The method may further include selecting one of the subarrays as specified by the second subset of row address bits in the next address command.

The second number may be greater than the fourth number. The data may be further arranged in subarrays of the rows and columns, each of the subarrays being a subset of the rows and columns and respectively indexed by the first number of row address bits and the fourth number of column address bits. The fourth subset of column address bits may be the fourth number of column address bits. The memory device may include a row buffer for each of the subarrays. The method may further include, for each subarray of the subarrays, loading a corresponding said row buffer with row data from the subarray as specified by the first number of row address bits in response to the row address command.

The method may further include selecting one of the subarrays as specified by the third subset of column address bits in the previous address command.

According to another embodiment of the present invention, a memory device is provided. The memory device includes storage cells for storing data arranged in an array of rows and columns respectively indexed by a first number of row address bits and a second number of column address bits. The data in the memory device is addressed using an architecture defined by a row address command specifying a third number of row address bits followed by a column address command specifying a fourth number of column address bits. The first number is greater than the third number or the second number is greater than the fourth number. The addressing of the data includes: splitting the first number of row address bits into a first subset of row address bits and a second subset of row address bits, and specifying the first subset in the row address command and the second subset in a next address command when the first number is greater than the third number; issuing the row address command as all or part of a row access of a row of the memory device; splitting the second number of column address bits into a third subset of column address bits and a fourth subset of column address bits, and specifying the fourth subset in the column address command and the third subset in a previous address command when the second number is greater than the fourth number; and issuing the column address command as all or part of a column access of the row.

The next address command may be the column address command or the previous address command may be the row address command.

The issuing of the column address command may immediately follow the issuing of the row address command.

The first number may be greater than the third number. The architecture may be further defined by a first access time representing a delay between the column address command and availability of the data on a data bus. The addressing of the data may further include: performing an initial column access of the row in a second access time, the second access time being longer than the first access time; and performing a subsequent column access of the row in the first access time.

The addressing of the data may further include issuing the next address command or the previous address command after the row address command and before the column address command.

The issuing of the next address command may immediately follow the issuing of the row address command or the issuing of the previous address command may immediately precede the issuing of the column address command.

The first number may be greater than the third number. The data may be further arranged in subarrays of the rows and columns, each of the subarrays being a subset of the rows and columns and respectively indexed by the third number of row address bits and the second number of column address bits. The first subset of row address bits may be the third number of row address bits. The memory device may further include a row buffer for each of the subarrays. The addressing of the data may further include, for each subarray of the subarrays, loading a corresponding said row buffer with row data from the subarray as specified by a corresponding said first subset of row address bits in response to the row address command.

The addressing of the data may further include selecting one of the subarrays as specified by the second subset of row address bits in the next address command.

The second number may be greater than the fourth number. The data may be further arranged in subarrays of the rows and columns, each of the subarrays being a subset of the rows and columns and respectively indexed by the first number of row address bits and the fourth number of column address bits. The fourth subset of column address bits may be the fourth number of column address bits. The memory device may further include a row buffer for each of the subarrays. The addressing of the data may further include, for each subarray of the subarrays, loading a corresponding said row buffer with row data from the subarray as specified by the first number of row address bits in response to the row address command.

The addressing of the data may further include selecting one of the subarrays as specified by the third subset of column address bits in the previous address command.

According to yet another embodiment of the present invention, a memory module is provided. The memory module includes a plurality of memory devices. Each memory device of the memory devices includes storage cells for storing data arranged in an array of rows and columns respectively indexed by a first number of row address bits and a second number of column address bits. The data in the memory device is addressed using an architecture defined by a row address command specifying a third number of row address bits followed by a column address command specifying a fourth number of column address bits. The first number is greater than the third number or the second number is greater than the fourth number. The addressing of the data includes: splitting the first number of row address bits into a first subset of row address bits and a second subset of row address bits, and specifying the first subset in the row address command and the second subset in a next address command when the first number is greater than the third number; issuing the row address command as all or part of a row access of a row of the memory device; splitting the second number of column address bits into a third subset of column address bits and a fourth subset of column address bits, and specifying the fourth subset in the column address command and the third subset in a previous address command when the second number is greater than the fourth number; and issuing the column address command as all or part of a column access of the row.

The next address command may be the column address command or the previous address command may be the row address command.

The issuing of the column address command may immediately follow the issuing of the row address command.

The first number may be greater than the third number. The architecture may be further defined by a first access time representing a delay between the column address command and availability of the data on a data bus. The addressing of the data may further include: performing an initial column access of the row in a second access time, the second access time being longer than the first access time; and performing a subsequent column access of the row in the first access time.

The addressing of the data may further include issuing the next address command or the previous address command after the row address command and before the column address command.

The issuing of the next address command may immediately follow the issuing of the row address command or the issuing of the previous address command may immediately precede the issuing of the column address command.

For each memory device of the memory devices: the first number may be greater than the third number; the data may be further arranged in subarrays of the rows and columns, each of the subarrays being a subset of the rows and columns and respectively indexed by the third number of row address bits and the second number of column address bits, the first subset of row address bits being the third number of row address bits; the memory device may further include a row buffer for each of the subarrays; and the addressing of the data may further include, for each subarray of the subarrays, loading a corresponding said row buffer with row data from the subarray as specified by a corresponding said first subset of row address bits in response to the row address command.

For each memory device of the memory devices: the second number may be greater than the fourth number; the data may be further arranged in subarrays of the rows and columns, each of the subarrays being a subset of the rows and columns and respectively indexed by the first number of row address bits and the fourth number of column address bits, the fourth subset of column address bits being the fourth number of column address bits; the memory device may further include a row buffer for each of the subarrays; and the addressing of the data further include, for each subarray of the subarrays, loading a corresponding said row buffer with row data from the subarray as specified by the first number of row address bits in response to the row address command.

Each of the memory devices may be a phase-change random access memory (PRAM) device.

According to the above and other embodiments, new methods for addressing high capacity SDRAM-like memory without increasing pin cost or pin count are provided. These methods may be configurable at initialization, based on information and support from the module. While adding more address pins is one way to solve the addressing vs. capacity problem, pins are costly, and it is normally desirable to retain SDRAM (e.g., DDR4) pin definitions.

BRIEF DESCRIPTION OF THE DRAWINGS

The accompanying drawings, together with the specification, illustrate example embodiments of the present invention. These drawings, together with the description, serve to better explain aspects and principles of the present invention.

FIG. 2, which includes

FIG. 4, which includes

FIG. 7 is a DDR4 SDRAM truth table for an example extended Read (RD+) command according to an embodiment of the present invention.

FIG. 9 is a DDR4 SDRAM truth table for an example extended Write (WR+) command according to an embodiment of the present invention.

FIG. 10 is a diagram of an example column organization of a memory chip according to an embodiment of the present invention.

FIG. 11 is a flow diagram of an example method for addressing a memory device according to an embodiment of the present invention.

DETAILED DESCRIPTION

Figure 1:
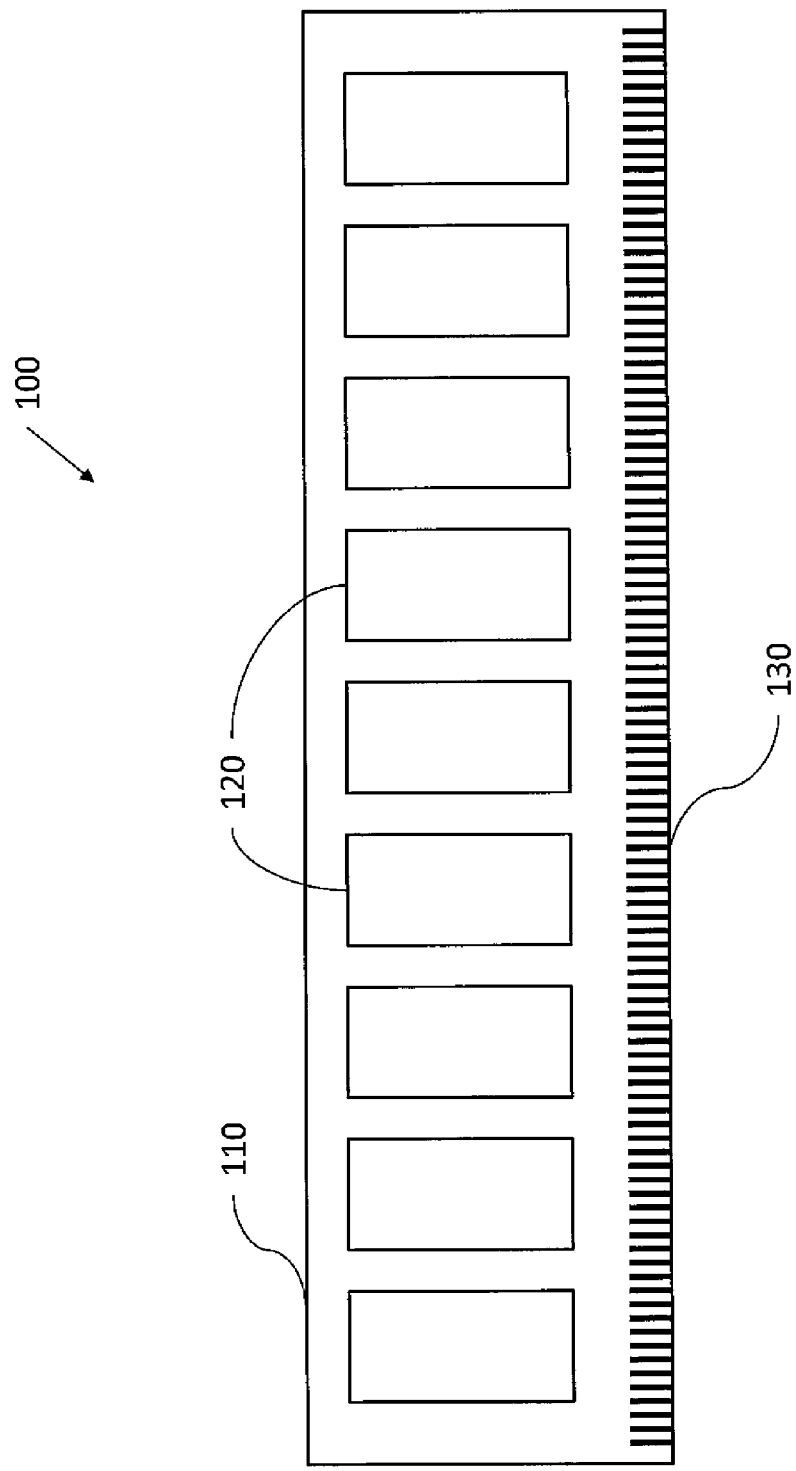
FIG. 1 is a schematic diagram of an example memory module and memory devices according to an embodiment of the present invention.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein.

Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed.

The electronic or electric devices and/or any other relevant devices or components according to embodiments of the present invention described herein may be implemented utilizing any suitable hardware, firmware (e.g., an application-specific integrated circuit (ASIC)), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

In addition, the various components of these devices may be a process or thread, running on one or more computer processors (such as microprocessors), in one or more computing devices, executing computer program instructions and interacting with other system components for performing the various functionalities described herein. The computer program instructions may be stored in a memory that may be implemented in a computing device using a standard memory device such as random access memory (RAM). The computer program instructions may also be stored in other, non-transitory, computer readable media such as, for example, a CD-ROM, flash drive, or the like.

Further, a person of skill in the art should recognize that the functionality of various computing devices may be combined or integrated into a single computing device, or the functionality of a particular computing device may be distributed across one or more other computing devices without departing from the spirit and scope of the present invention.

In DDR4 SDRAM, memory devices (e.g., chips) are organized in an array of rows and columns. The row represents the granularity of access, e.g., the amount of data in the SDRAM device (such as 512, 1024, or 2048 bytes) that is accessed when any location of memory within the row of that device is read from or written to. The column represents the specific portion (such as 4, 8, or 16 bits, also referred to as a data word) within the row that is being read from or written to. The row address is supplied first (such as with an ACT command), to bring that row from the SDRAM device into a row buffer, followed by the column address (such as with a RD or WR command) to read from or write to a particular portion of the row while the row is in the row buffer. Since each row is a relatively small number of bytes compared to the capacity of the device, there are far more rows than columns. Accordingly, more bits (or pins in the hardware) are used to address a row than to address a column in that row.

Further, since the row address is supplied first and is a larger address than the column address, some of the row address pins in DDR4 SDRAM are reused to supply the column address. When the number of rows and columns in the underlying memory chips are balanced with respect to this relationship, the address pins may be effectively reused during the column address command, thus making efficient use of the architecture. However, when the number of rows and columns are not well balanced, the address pins may not be effectively reused, therefore limiting the capacity that may be addressed. For example, in DDR4, the number of rows is addressable in 18 bits, and the number of columns is addressable in 10 bits. This imposes limits on the size of the corresponding memory chips as well as the organization of the data (number of rows and columns) to make full use of the addressability. For example, memory chips supporting many rows (e.g., more than 18 addressing bits worth) but relatively few columns may not be able to take full advantage of this addressing scheme.

According to one or more embodiments, methods and structures of supporting high capacity memory modules (such as DDR4 SDRAM memory modules) are provided. For example, some embodiments may provide SDRAM-like (e.g., DDR4) address pin definitions for accessing non-volatile (such as PRAM, or phase change memory) storage.

According to one or more embodiments, an Activate (ACT) command extension (e.g., ACT+) is provided. This new ACT command may be an extension of the existing ACT command with one more cycle added for extended addressing capability (such as an extended row address). In another embodiment, this ACT+ command may be a new (separate) command for extended addressing capability.

According to one or more other embodiments, a RD/WR+ (e.g., Read, Write, or other column address command) extension is provided. These new commands may be extensions of the existing RD/WR commands with one more cycle added for extended addressing capability (such as an extended column address). In still other embodiments, the RD/WR+ command may be a new (separate) command for extended addressing capability.

According to other embodiments, modified back-to-back row access/column access (RAS/CAS, which stand for "row access strobe" and "column access strobe") commands (such as modified read or write commands) are provided, together with corresponding timing modifications. By way of example, new RD/WR CAS (read/write commands and their corresponding column select bits) definitions may be provided such that unused bits (e.g., row or column address bits that are unused during column address commands) may be repurposed to carry extended row address, effectively increasing the number of addressing bits past an otherwise set or predetermined (e.g., architecture-imposed) limit. For instance, in one or more embodiments, new timing parameters in a modified ACT and RD/WR timing dependency may be used to support such new (or repurposed) RD/WR commands.

According to yet other embodiments, modified back-to-back column access (CAS/CAS) commands are provided. By way of example, new RD/WR commands may be provided to support extended column (or row) addressability by providing extended column or row address bits in one of the two CAS commands.

According to still other embodiments, multi-row buffer organization is provided (e.g., with command modification and device reorganization). By way of example, while the underlying architecture may only support so many row addresses, a new device organization may be provided that has additional row address indexing. For instance, in one or more embodiments, new RD/WR (CAS) commands may be provided such that unused bits (e.g., unused row or column address bits during a column address command) are repurposed to carry an extended address, such as an extended row address or an extended column address.

According to yet still other embodiments, multi-column buffer organization is provided (e.g., with command modification and device reorganization). By way of example, while the underlying architecture may only support so many column addresses, a new device organization may be provided that has additional column address indexing. For instance, in one or more embodiments, a new ACT (RAS) command may be provided such that unused bits (e.g., unused row address bits during a row address command) are repurposed to carry an extended address, such as an extended column address.

The above and other methods according to embodiments of the present invention may be configurable at initialization of each memory device of the memory module, based on information and support from the module.

For ease of description, what follows is based primarily on the JEDEC DDR4 SDRAM standard (or DDR4 for short), which may employ 4-bit, 8-bit, or 16-bit wide DRAM chips, but the present invention is not limited thereto. In other embodiments, different standards, such as other SDRAM standards (including other double data rate (DDR) standards), may apply and still fall within the spirit and scope of the present invention, as would be apparent to one of ordinary skill in the art. Unless described to the contrary, when referring to DDR4, the JEDEC Standard for DDR4 SDRAM, volume JESD79-4A (November 2013) of the JEDEC Solid State Technology Association governs, the entire content of which is herein incorporated by reference.

In addition, throughout, the term "KB," "MB," "GB," and "TB" refer to power-of-two multiples of a byte (B, or 8 bits in standard computer architecture), namely 1 KB=1024 bytes, 1 MB=1024 KB, 1 GB=1024 MB, and 1 TB=1024 GB. For further ease of description, DRAM chips will be assumed to be data chips and number in powers of two (e.g., 4 chips, 8 chips, or 16 chips per rank), though in practice other numbers of chips (e.g., an extra chip for every 8 data chips) may be used for functions such as error detection or correction. For still further ease of description, the term "page" will be used somewhat synonymously with "row" herein; both relate to the portion of memory on a memory chip corresponding to a particular row. In a similar fashion, both "chip" and "device" will be used somewhat synonymously throughout when referring to memory hardware;

both refer to the smallest separately pluggable (or sometimes addressable, as with stacked memory chips) memory component of a memory module.

FIG. 1 is a schematic diagram of an example memory module 100 and memory devices 120 according to an embodiment of the present invention.

For example, the memory module 100 may be a DIMM, such as a DDR4 SDRAM DIMM. The memory module 100 may include a printed circuit board (PCB) 110 including pin interconnections, the memory devices 120 (e.g., memory chips, such as random access memory (RAM) chips mounted on the PCB 110, and pins 130 for connecting the memory devices 120 to an electronic device that uses the memory module 100, such as a microprocessor in a workstation or personal computer. The PCB 110 may have pins 130 and devices 120 on both sides and pin interconnections throughout, and the devices 120 may be stacked (e.g., using through-silicon via, or TSV).

Figure 2A:
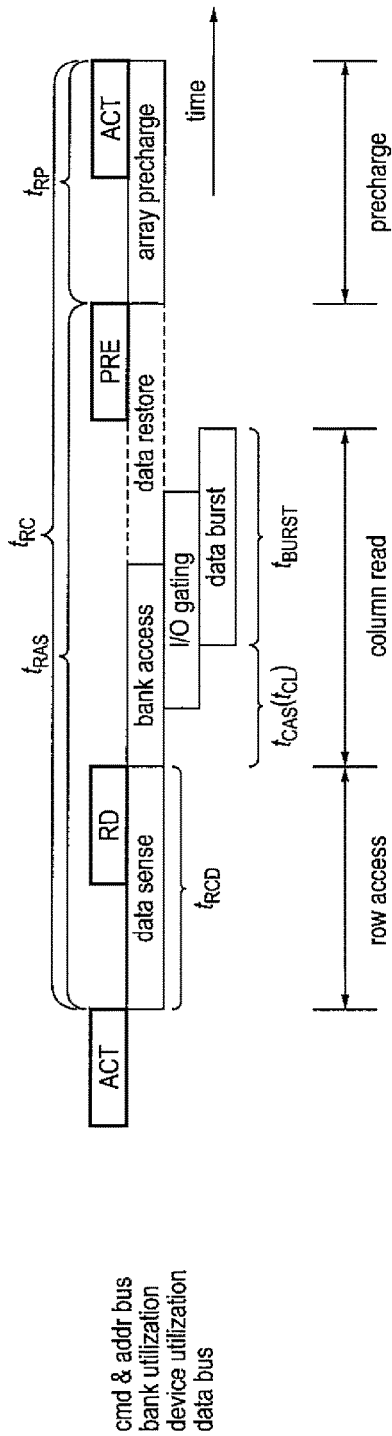
FIG. 2A and FIG. 2B, is a diagram of an example data access operation using an extended Activate (ACT+) command according to an embodiment of the present invention.
Figure 2B:
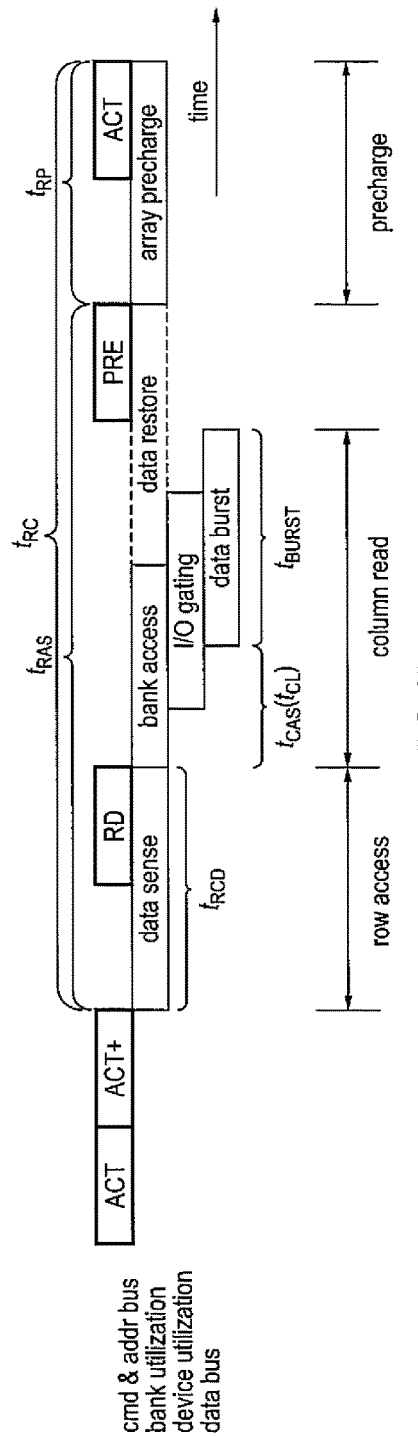

FIG. 2, which includes FIG. 2A and FIG. 2B, is a diagram of an example data access operation using an extended ACT (Activate), or ACT+, command according to an embodiment of the present invention.

In FIG. 2 (and subsequent drawings), various timing parameters (e.g., tRC, tRAS) are illustrated. These parameters will be further described where particularly relevant; otherwise, their definitions and use are as provided in the JEDEC DDR4 SDRAM Standard or as known to those of ordinary skill in the art.

In DDR4, 3 pins are used for CID (chip ID, or rank), 4 pins for bank (e.g., separate arrays of rows and columns within each memory chip), and 18 pins for row (and column) addressing. The address pins for DDR4 SDRAMs are reused for row and column addressing. In DDR4, a memory controller may access an SDRAM address using 2 commands on the same pins during different cycles: ACT (Activate) and RD/WR (read/write). The ACT command may activate a row using a row address (18 pins), loading the row into a row buffer, while the RD/WR command may use a column address (10 pins) to select the corresponding column from the row buffer. Here, "RD/WR" is shorthand for a read (RD) command or a write (WR) command (or other column address command), and the two types or classes of command will not be distinguished any further unless explicitly so mentioned (e.g., "RD/WR," "RD," and "WR" may be used synonymously to refer to a read or write command).

In DDR4, the current pin usage and addressing scheme may not support high capacity memory. For example, current DDR4 can support only 256 GB per DIMM, assuming 2 GB per DRAM chip together with a chip configuration such as 16 DRAM chips (concurrently addressable) per rank (e.g., each DRAM chip supplies 4 bits of data for a total of 16×4 bits=64 bits of data access at a time in the rank), and 8 ranks (or sets of (possibly stacked) DRAM chips).

However, these capacities are only obtainable in precise configurations such as this. In many cases, there is an imbalance between the architecture-defined (intended) numbers of rows and columns and the actual number of rows and columns supported in the underlying hardware (e.g., too many rows and too few columns in the hardware than was designed for efficient implementations of the architecture, or perhaps the reverse, such as too few rows and too many columns), essentially wasting pins. To increase overall capacity, or to allow for imbalanced row/column numbers, one solution would be to add more pins. Unfortunately, this is expensive, and may require a re-working of current DDR4 standards.

As illustrated in FIG. 2B, according to an embodiment of the present invention, one possible solution may be to use an extended ACT (ACT+) command, in this case a two-cycle ACT command (instead of the usual one-cycle ACT command). See FIG. 2A and compare for an implementation in DDR4 of the standard ACT command. In FIG. 2A and FIG. 2B (and other timing diagrams), time is illustrated moving forward from left to right, with four separate horizontal resources being accessed, namely from high to low, (i) memory command and address bus, (ii) memory bank, (iii) memory device (e.g., DRAM chip), and (iv) memory data bus. Briefly, a set of memory (DRAM) chips making up a rank on a memory module (such as a DIMM, or dual inline memory module) is accessed in banks (logical divisions within a memory chip), each bank being made up of rows, and each row being made up of columns.

Each DIMM may include multiple such sets of DRAM chips, or ranks. For ease of description, only a single rank along with a single bank within that rank will be considered when accessing a DIMM. The ACT command may specify a bank (e.g., 3 or 4 bits) and a row (e.g., up to 18 bits) within that bank. From left to right in FIG. 2A and FIG. 2B, the row is accessed first (as specified by the ACT command), followed by a column (as specified by a RD/WR command, such as RD). This causes a burst of data to be read or written, such as 4 or 8 data words per device, or 32 or 64 bytes per DIMM. Further accesses of 4 or 8 data words in the same row of each device (32 or 64 contiguous bytes in the DIMM) may be accomplished quickly. However, to access a different row, a precharge command (PRE) may be used to write the current row back into the memory array in preparation for a next row to be accessed by a succeeding ACT command.

In the embodiment of FIG. 2B, an extended ACT command (ACT+) is used. Here, the ACT command is illustrated as being extended from one clock cycle to two clock cycles, e.g., the ACT may supply additional address bits in the second clock cycle (ACT+), such as to increase the number of row address bits supplied. In DDR4, for example, the additional ACT+ clock cycle may be used to send another 18 bits (extended bits) of row address (36 bits total) over the same row address pins, which may also allow for significantly narrower rows (e.g., fewer numbers of columns) while still being able to address the same (or more) amount of data. In other embodiments, only 10 or 12 row address bits may be provided in the ACT+ command so that the ACT+ command may have a proper op code.

For instance, in some embodiments, memory devices supporting the ACT+ command may be configured at initialization time to recognize either the standard ACT (single cycle) RAS command, or the new (two cycle) ACT/ACT+ protocol. That way, there would be only one ACT command, with the memory device either expecting it to be issued once (ACT) if the standard DDR4 architecture is being implemented, or twice in consecutive cycles if the extended ACT (ACT+) protocol is being used.

With the ACT+ command as described above (e.g., 36 row address bits over two cycles), even in the extreme case of each row containing only a single 4-bit column, a single DRAM chip using this extended row addressability could access $2^{40}$ such 4-bit columns (nibbles, or half-bytes), or 512 GB of data (e.g., using 4 bits of bank address and 36 bits of extended row address) in DDR4 architecture, and without any change or increase in pin count or pin cost. This is already greater capacity in a single memory chip than the DDR4 standard provides for an entire DIMM (which may include up to 128 DRAM chips).

In some embodiments, the narrower rows may be exploited by PRAM (phase-change RAM), which may replace conventional SDRAM chips to build DDR4 DIMMs with such an ACT+ extension. For example, PRAM may be more amenable to large numbers of narrow rows (e.g., few columns), compared to comparable SDRAM chips, which may have 512-byte rows for 4-bit wide DRAM chips (e.g., 1024 columns).

In another embodiment of an extended ACT command, the ACT command may be left unchanged and simply followed by a new one cycle command called "ACT+" to carry additional addressing bits (e.g., 10 or 12 bits). For example, as illustrated in FIG. 2B, the ACT+ command may immediately follow the first ACT command to carry extended row information (e.g., working in a similar manner to the two-cycle ACT+ command described above). Since the new ACT+ command itself may require significantly more bits to specify than the ACT command (which has a dedicated command bit in DDR4), the remaining number of available address bits may be somewhat smaller (e.g., 10 or 12 bits instead of 18) than would be available if the standard ACT command was lengthened from one cycle to two.

Figure 3:
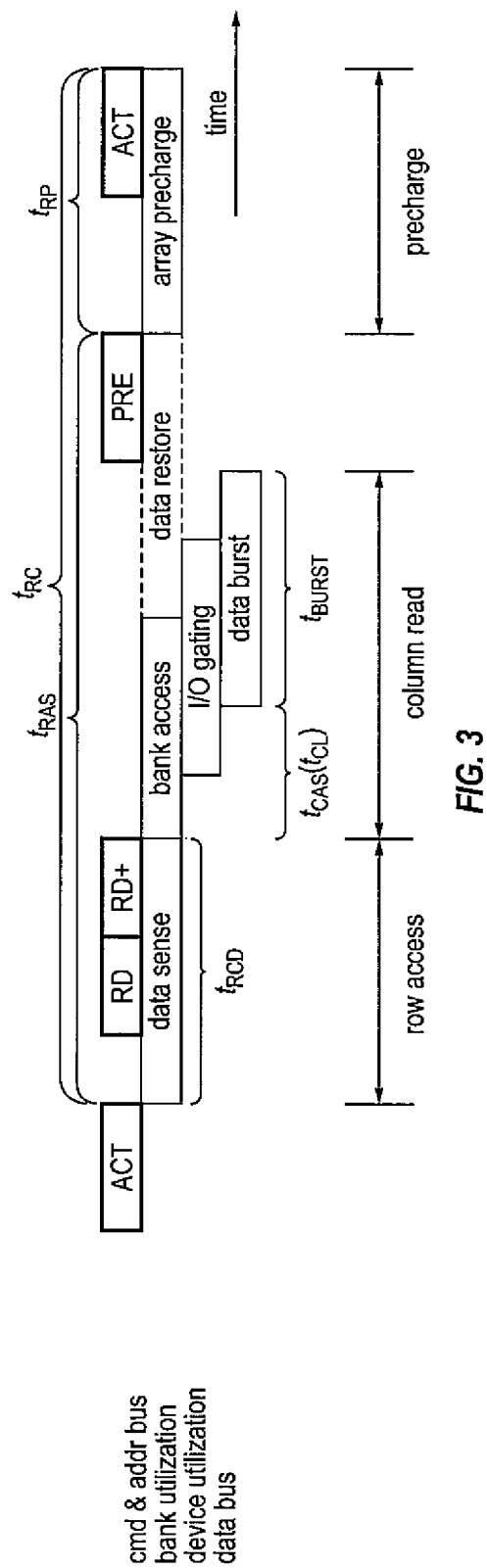
FIG. 3 is a diagram of an example data access operation using an extended Read (RD+) command according to an embodiment of the present invention.

FIG. 3 is a diagram of an example data access operation using an extended Read (RD+) command according to an embodiment of the present invention.

In other embodiments such as that illustrated in FIG. 3, the RD/WR command (or any column address command) may be modified similarly to the above-described modifications to the ACT command to carry additional column information. For example, the DRAM size may be grown by enlarging the column size from 10 column address bits to, e.g., 20 or 22 column address bits by using a RD/WR+ command to specify further addressing bits (e.g., 10 or 12 more column addressing bits), without increasing pin cost or pin count. Either of these techniques (or both used in combination) may significantly increase memory chip addressability (e.g., into the TB size or more) without any change in pin cost or pin count.

The particular implementation of ACT+ or RD/WR+ does not need to be fixed in a DIMM. For example, in some embodiments, the selection of which extended ACT command or extended RD/WR command system to use (if any) may be made at initialization (and may be changed in succeeding initializations).

Figure 4A:
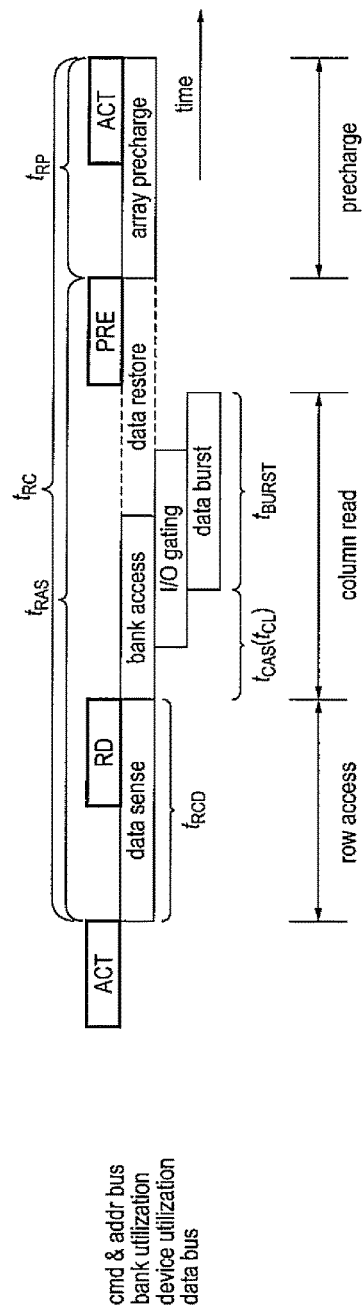
FIG. 4A and FIG. 4B, is a diagram of an example data access operation using a back-to-back RAS/CAS command sequence according to an embodiment of the present invention.
Figure 4B:
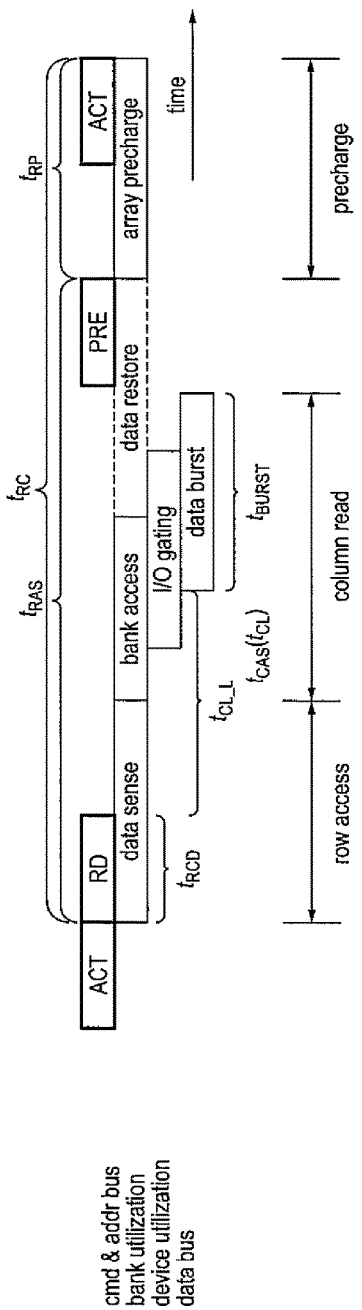

FIG. 4, which includes FIG. 4A and FIG. 4B, is a diagram of an example data access operation using a back-to-back RAS/CAS command sequence according to an embodiment of the present invention. While RAS may originally have stood for "row address strobe" and CAS for "column address strobe," as used herein, these terms refer mostly to the supplying of the row address and column address, respectively, in a memory chip read or write operation. See also FIG. 6 and description below for an example of a double CAS (e.g., back-to-back CAS) sequence to provide additional address bits.

FIG. 4 illustrates an additional technique to provide for additional row/column information, namely using a new back-to-back RAS/CAS system. In this mechanism, a new RD/WR (CAS) is defined such that otherwise unused address bits (column or row) may carry extended address information, and the command may be provided sooner than the standard RD/WR command. By way of example, in DDR4, three of the high-order row address bits are available along with the CAS bits for use with the RD and WR instructions. By way of another example, the underlying memory device may support fewer columns than the 10 column address bits provide for, so some of these extra column address bits may be reassigned to carry extended row address bits.

By way of yet another example, high-order row address bits provided for controlling dynamically selectable features (such as on-the-fly data burst length) in column address commands may be repurposed as additional extended address bits and the specific dynamic features defaulted to their static settings.

Along with these column address changes, a new timing parameter and modified ACT and RD/WR timing dependency may be introduced to support the repurposed RD/WR command. These are illustrated in FIG. 4A and FIG. 4B, with FIG. 4A illustrating the standard RD/WR protocol (the RD/WR instruction being represented by RD) and FIG. 4B illustrating the modified RAS/CAS command sequence.

In further detail, in standard DDR4, as illustrated in FIG. 4A, the ACT command provides the row address (RAS, 18 bits) while the subsequent RD/WR command provides the column address (CAS, 10 bits). These 28 (18+10) bits, together with up to 4 bank bits, address the data width (e.g., 4, 8, or 16 bits) in each DRAM chip that makes up a rank (e.g., 4, 8, or 16 memory chips) for a particular (e.g., 64 bit) read or write access of the rank. However, by sending RAS and CAS back-to-back, the bits devoted to RAS and CAS, together with any unused address bits (e.g., the three unused row address bits in a CAS command like RD or WR) may be reconfigured to provide extended row or column addressing in a different format or breakdown, such as to make full use of memory chips having different row and column arrangements than those architected in DDR4.

Further, for an extended row address, the memory devices may be configured to initially access all the rows specified in the ACT command (e.g., with the 18 available row address bits, to avoid delay in accessing data), narrowing down the selection with the remaining (extended) row address bits in the (possibly immediately) following RD command. For example, the devices may have a row buffer for every possible row that can be addressed with the first 18 row address bits. In another embodiment, the devices may start loading all such rows into a single row buffer, but only allowing the actual row to load into the row buffer once the remainder of the row address is provided.

For example, with 31 bits (18 RAS+10 CAS+3 unused) available for addressing in the back-to-back RAS/CAS command sequence, 18 bits of an extended row address may be provided in the ACT command, followed by the remaining 10 bits of the extended row address in the immediately succeeding RD/WR command along with a 3 bit (e.g., 8 columns) column address. Total addressability thus increases 8-fold without any increase in pin count and the underlying row and column sizes may be adjusted to better suit the underlying memory chip technology (such as PRAM). Put another way, in some embodiments, the RAS may just carry a part of the row address, while the CAS (possibly extended by some of the unused address bits) may carry the rest of the extended row address along with the column address (or vice versa for extended column addresses, as may be used in other embodiments).

This command sequence modification may require modifying the timing parameters used by the memory controller to access the memory module. For example, in DDR4, tRCD and tCL may be affected. Here, tRCD (also known as RAS to CAS delay) refers to the minimum time (e.g., clock cycles) between an ACT command and when the first subsequent RD or WR command may be serviced (e.g., as measured from the start (or end) of the ACT command to the corresponding start (or end) of the RD/WR command). Further, tCL (or tCAS, also known as CAS latency) refers to the time between supplying the CAS and the time that the first data access of the column is available on the data bus. In FIG. 4B, it should be noted that the total tRCD+tCL time is the same as in FIG. 4A (e.g., tRCD may shorten by the same amount that tCL lengthens).

To help avoid performance issues of the longer tCL time in FIG. 4B, such as with open-page (open-row) policies, in some embodiments, new timing parameters tCL_L (long) and tCL_S (short) may be defined. Here, tCL_L (e.g., the tCL illustrated in FIG. 4B) may be used with tRCD to first access a column within a page, and tCL_S may be used for subsequent row buffer (e.g., same row, different column) accesses for open pages. This is similar or analogous to some timing parameters already present in DDR4 where there is a long and short difference (e.g., tRRD_L and tRRD_S); the memory controller may keep track of when to use tCL_L or tCL_S. No additional commands may be needed for such an implementation, and the memory component does not need to be aware of the different tCL.

Figure 5:
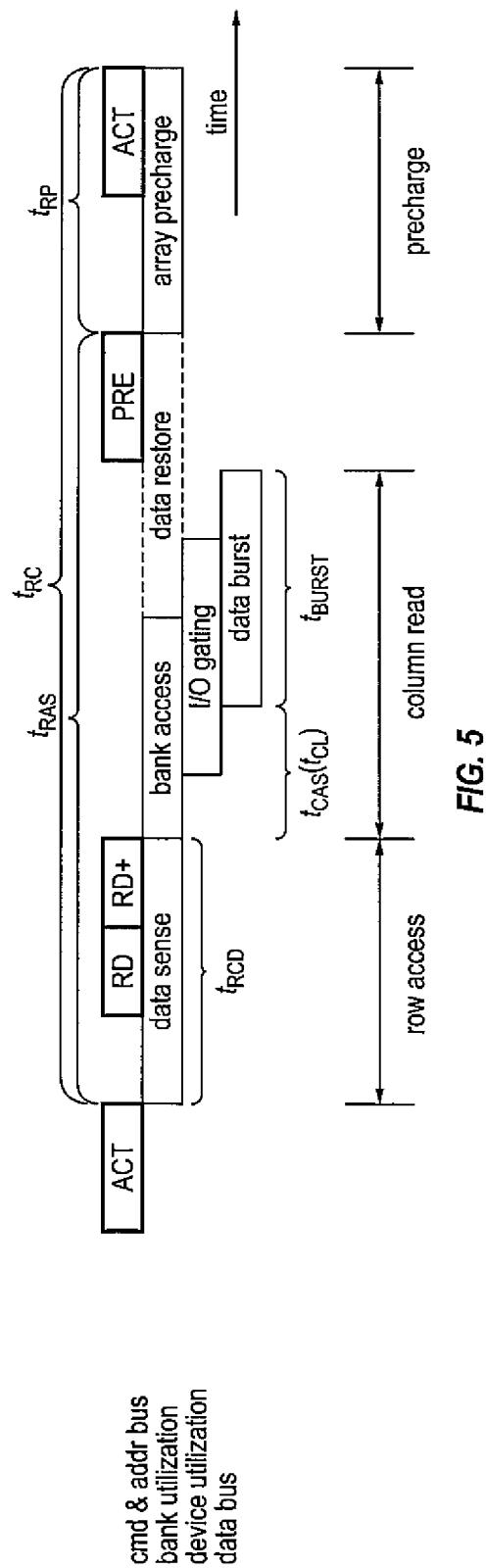
FIG. 5 is a diagram of an example data access operation using a back-to-back CAS/CAS (double CAS) command sequence according to an embodiment of the present invention.

FIG. 5 is a diagram of an example data access operation using a back-to-back CAS/CAS (double CAS) command sequence according to an embodiment of the present invention.

In FIG. 5, two CAS commands (e.g., back-to-back CAS or double CAS commands, as illustrated by example as two RD commands, RD and RD+) may be used to extend the address. For example, one or both of the CAS commands may supply additional (extended) address bits. The assignment may be configured based on the underlying memory device, moving address bits to the more appropriate of the two CAS commands to exploit features of the memory device. For instance, if the memory device supports large rows with more columns than may be addressed with a single CAS command, the additional column address bits may be supplied in the first CAS command to function as a "logical row" address extension that effectively partitions each of the large rows into many smaller rows, each of which is the largest possible row size under the standard architecture. The second CAS command may then function similarly to a standard CAS command.

For another example, if the memory device supports a very large number of small rows (e.g., more rows than are otherwise addressable), the first CAS command may be a standard CAS command for selecting the particular column within a row, with a separate row buffer for each possible corresponding row address matching the initial RAS command. The second CAS command may then be used as a row buffer select to choose which row buffer actually supplies (or receives) the data. In still other embodiments, the extended address bits may be arranged in other logical ways (e.g., redistributed within the double CAS commands) to take advantage of the increased addressability.

Figure 6:
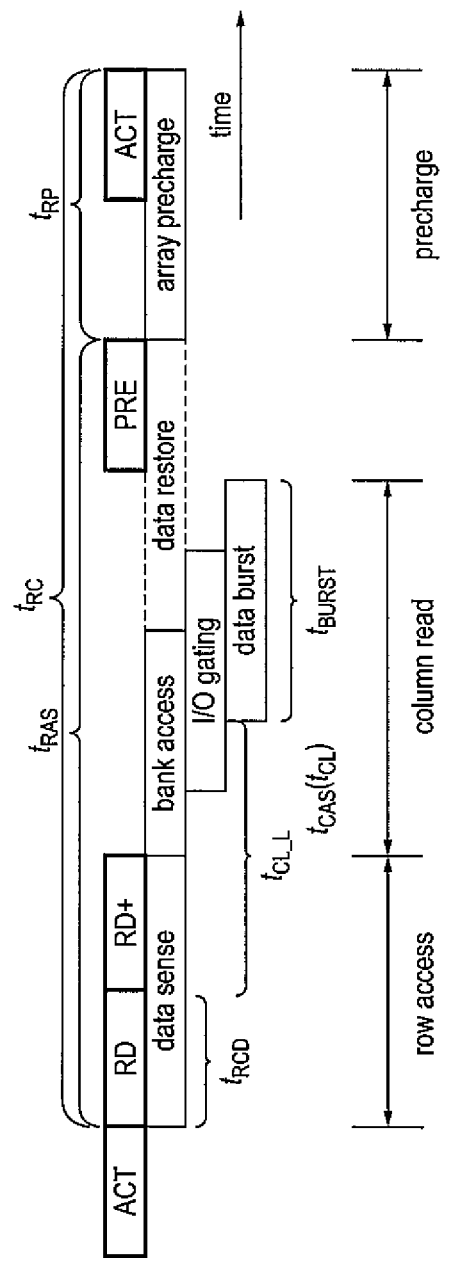
FIG. 6 is a diagram of an example data access operation using a back-to-back RAS/CAS or CAS/CAS command sequence according to other embodiments of the present invention.

FIG. 6 is a diagram of an example data access operation using a back-to-back RAS/CAS or CAS/CAS command sequence according to other embodiments of the present invention.

Here, two CAS commands (e.g., back-to-back CAS or double CAS commands, as illustrated by example as two RD commands) may be used to extend the address even further than in the embodiment of FIG. 4B. The second RD command in FIG. 6 is illustrated as a RD+ command. Similar to the ACT+ command described above with reference to FIG. 2B, the extra command may be used to supply extra address bits, such as 10 or 12 more address bits. This may be combined with earlier techniques as well.

As non-limiting examples, the RD+ command may be used to supply the column address, with the first RD command supplying the remaining row address bits of an extended row address. In another embodiment, the RD+ may be used to supply the remaining address bits of an extended column address, the initial column address bits being supplied with the first RD command. In yet another embodiment, the first RD may immediately follow the ACT command (e.g., supplying extra row address bits and possibly some column address bits as part of a back-to-back RAS/CAS sequence), while the RD+(or second RD) may be delayed until the normal column access time to supply all or part of the column address.

In still another embodiment, the address bits (such as column address bits) may be redistributed between the two CAS (such as RD or WR) commands as appropriate to accommodate the underlying hardware. For example, successive accesses to the same (wide) row whose (extended) column addresses do not fit in a single command may have their extended column addresses split across a pair of consecutive RD or WR (CAS) commands.

While FIG. 6 illustrates an ACT, RD, and RD+ commands being contiguous, there may be delays or gaps between adjacent commands, such as between the ACT and RD commands, or between the RD and RD+ commands, depending on the embodiment.

FIG. 7 is a DDR4 SDRAM truth table for an example extended Read (RD+) command according to an embodiment of the present invention.

Referring to FIG. 7, the RD+ command is intended to be delivered over two command cycles. In this example, the RD+ command may be configured at initialization time and may be distinguished from the RD command by making use of the third chip ID bit C2 (e.g., C2=H for RD+ and C2=L for RD). While this may limit stacked memory chips to only four, in other embodiments, a different bit may be used to distinguish the two commands. In addition, in FIG. 7, the on-the-fly burst mode bit BC_n may also be repurposed to its extended address bit A12 definition. While this may disable on-the-fly burst mode selection, burst mode may still be changed as needed via a mode register setting and, in other embodiments, a different bit may be used to extend the address.

Accordingly, the RD+ command of FIG. 7 may deliver four additional extended address (EA) bits in addition to the usual ten column address (CA) bits, two bank group (BG) bits, and two bank address (BA) bits. The EA bits may be used, for example, to specify further row or column address information outside of the 18 bit row address (RA) specified in the ACT command or the 10 bit CA.

Further, the RD+ command of FIG. 7 has a second command cycle immediately following the first command cycle, this time using an unused command code (identified in the DDR4 architecture as Reserved for Future Use, or RFU), together with a two-bit priority field and a 10-bit read ID (RID) field (the three remaining bits shown in FIG. 7 are also RFU). The priority and read ID fields may, for example, supply additional information (e.g., additional address bits or buffer selection bits) to the memory devices when the devices have additional capabilities or storage (e.g., more rows or buffers) than accounted for in the DDR4 architecture.

Figure 8:
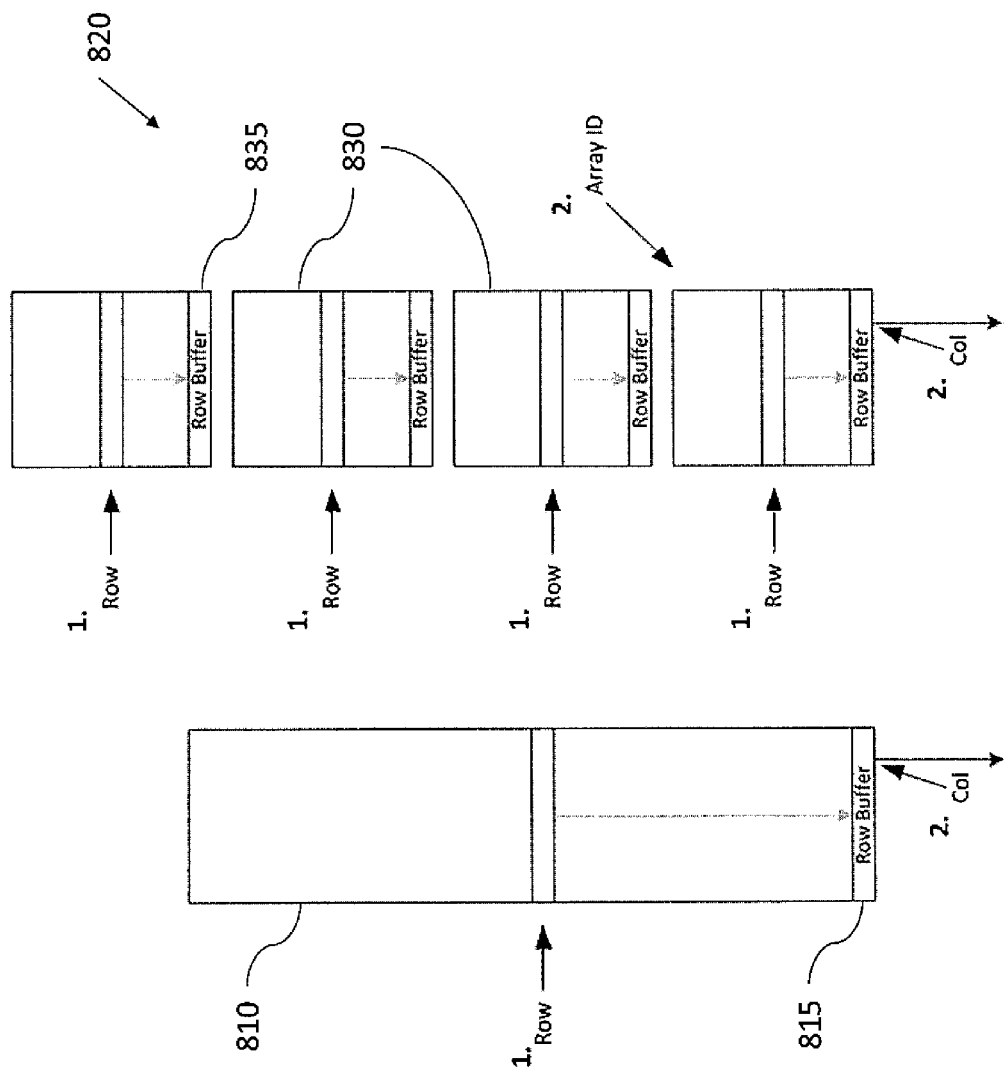
FIG. 8 is a diagram of an example row organization of a memory chip according to an embodiment of the present invention.

FIG. 8 is a diagram of an example row organization of a memory chip according to an embodiment of the present invention.

In some embodiments, an additional technique to provide for additional row/column information without increasing pin count or pin cost may be to employ a multi-row buffer organization. Here, the memory device may have a new internal organization to support additional address indexing, and may utilize a new RD/WR (CAS) command system to convey extra information (such as repurposing otherwise unused CAS bits to designate part of an extended row address).

In further detail, as illustrated in FIG. 8, a comparably "narrow but tall" memory array 810 (e.g., many rows, but relatively few columns) with only one buffer (row buffer) 815 may be broken up into a similar structure 820 only having multiple, smaller arrays 830 (which are each "narrow but short," having fewer rows than memory array 810 but the same number of columns), each having their own buffer (row buffer) 835. For example, the memory array 810 may have more rows than are normally addressable (e.g., more than 17 or 18 bits of address space), while the array structure 820 may have arrays 830 all of whose rows are addressable (e.g., less than or equal to 17 or 18 bits of address space).

To address and access these row buffers 835, in some embodiments, an ACT with the row address for the target data array may be sent to each small array 830. Each array 830 responds by putting the information from that row into its own buffer 835. Next, a RD/WR with a column address and an array ID may be sent, that will read/write data to the buffer of that targeted array 830 (such as the bottommost array 830 illustrated in FIG. 8). Put another way, extended row addresses may be supported by supplying the low-order row address bits (row ID) in the ACT command, and the high-order row address bits (array ID) with the RD/WR command (such as in an unused portion of the CAS field or other unused address bits, e.g., the EA or RID bits in the RD+ command of FIG. 7). This may provide for significantly increased capacity with other technology memory chips (such as PRAM) and without added pin count, pin cost, or delay from issuing the ACT command to accessing the first data from the corresponding row.

In addition, further RD/WR commands to the same group of rows (e.g., sharing the same row ID) may be accomplished without another ACT command by using the same unused bits (e.g., EA, RID, unused CA) to specify a different array ID (whose buffer will already be loaded from the initial ACT command).

FIG. 9 is a DDR4 SDRAM truth table for an example extended Write (WR+) command according to an embodiment of the present invention.

Referring to FIG. 9, the WR+ command is a one-cycle command. In this example, the WR+ command may be configured at initialization time and may be distinguished from the WR command by making use of the third chip ID bit C2 (e.g., C2=H for WR+ and C2=L for WR). While this may limit stacked memory chips to only four, in other embodiments, a different bit may be used to distinguish the two commands. In addition, in FIG. 9, the on-the-fly burst mode bit BC_n may also be repurposed to its extended address bit A12 definition. While this may disable on-the-fly burst mode selection, burst mode may still be changed as needed via a mode register setting and, in other embodiments, a different bit may be used to extend the address.

Accordingly, the WR command of FIG. 9 may deliver four additional extended address (EA) bits in addition to the usual ten column address (CA) bits, two bank group (BG) bits, and two bank address (BA) bits. The EA bits may be used, for example, to specify further row or column address information outside of the 18 bit row address (RA) specified in the ACT command or the 10 bit CA.

FIG. 10 is a diagram of an example column organization of a memory chip according to an embodiment of the present invention.

As with the multi-row buffer organization of FIG. 8, an additional technique to provide for additional row/column information without increasing pin count or pin cost may be to employ a multi-column buffer organization as shown in FIG. 10. Here, the memory device may have a new internal organization to support additional address indexing, and may utilize a new ACT (RAS) command system to convey extra information (such as repurposing otherwise unused RAS bits to designate part of an extended column address).

In further detail, as illustrated in FIG. 10, a comparably "wide but short" memory array 1010 (e.g., few rows, but relatively many columns) with only one buffer (row buffer) 1015 may be broken up into a similar structure 1020 only having multiple, smaller arrays 1030 (which are each "narrow but short," having fewer columns than memory array 1010 but the same number of rows), each having their own buffer (row buffer) 1035. For example, the memory array 1010 may have more columns than are normally addressable (e.g., more than 10 bits of address space), while the array structure 1020 may have arrays 1030 all of whose columns are addressable (e.g., less than or equal to 10 bits of address space).

To address and access these row buffers 1035, in some embodiments, an ACT command with the (relatively small) row address for the target data array may be sent to each small array 1030, which may in turn load its corresponding row buffer 1035 with the desired row. In addition, a column address and an array ID may be provided (e.g., in one or two subsequent CAS commands, or possibly as part of the ACT command and one or two subsequent CAS commands) to identify the desired column within an array 1030 as well as the desired array 1030 (such as the third array 1030 from the left as illustrated in FIG. 10).

Put another way, extended column addresses may be supported by supplying the row address bits (row ID) in the ACT command, and the low-order column address bits (column ID) and high-order column address bits (array ID) in subsequent RD/WR command(s), possibly also making use of any unused address bits in the ACT command (such as providing the array ID in the ACT command). This may provide for significantly increased capacity with some memory chips (e.g., those amenable to large numbers of columns) and without added pin count, pin cost, or delay from issuing the ACT command to accessing the first data from the corresponding column. These and other techniques may also be combined where applicable, such as combining open page with the wide columns, such that succeeding accesses to the same wide row (e.g., to the same or different array ID) may be accomplished in normal CAS latency (tCL) time, and not incur another RAS delay.

FIG. 11 is a flow diagram of an example method of addressing a memory device according to an embodiment of the present invention.

Here, the memory device may be intended to be accessed using a particular architecture (such as DDR4 SDRAM), yet the device has more rows or more columns than the architecture supports (e.g., can address) in a normal configuration. However, according to embodiments of the present invention, the rows in the memory device may be accessed using an extended row address or the columns in the memory device may be accessed using an extended column address, and these addresses all fit in the combined row address and column address portions of the underlying architecture (e.g., in two or more successive RAS/CAS commands).

Referring to FIG. 11, in step 1110, when the row address has too many bits (e.g., the memory device has more rows than the architecture supports), the row address bits may be split into a first subset and a second subset, the first subset being specified in the row address command (e.g., ACT) and the second subset being specified in a next address command (e.g., ACT+, or RD/WR). In step 1120, the row address command may be issued as all or part of a row access of a row of the memory device. For example, when the memory device has fewer rows than the architecture supports, the entire row address may be specified in the row address command, while if the memory device has more rows than the architecture supports, only part of the row address (e.g., the first subset) may be specified in the row address command, and the remainder of the row address (e.g., the second subset) specified in the next address command.

Likewise, in step 1130, when the column address has too many bits (e.g., the memory device has more columns than the architecture supports), the column address bits may be split into a third subset and a fourth subset, the fourth subset being specified in the column address command (e.g., RD/WR or RD/WR+) and the third subset being specified in a previous address command (e.g., ACT, ACT+, or RD/WR). In step 1140, the column address command may be issued as all or part of a column access of the row. For example, when the memory device has fewer columns than the architecture supports, the entire column address may be specified in the column address command, while if the memory device has more columns than the architecture supports, only part of the column address (e.g., the fourth subset) may be specified in the column address command, and the rest of the column address (e.g., the third subset) may be specified in the previous address command.

If the total number of address bits (row and column) needed in the memory device is no greater than what may be specified in the row address command (e.g., ACT) and the column address command (e.g., RD/WR), then the next address command may be the column address command or the previous address command may be the row address command (such as with back-to-back RAS/CAS as described above). That is, two address commands (possibly back-to-back) may suffice to address the memory device.

On the other hand, if the total number of address bits (row and column) needed in the memory device is greater than what may be specified in the row address command and the column address command, then the next address command or the previous address command (e.g., ACT+ or RD/WR) may be issued between the row address command and the column address command. For example, the next address command and the previous address command may be the same command, and may specify extended row address bits or extended column address bits or possibly both. This next address command may also immediately follow the row address command (e.g., as in ACT+ or back-to-back RAS/CAS as described above) or immediately precede the column address command (e.g., as in back-to-back CAS/CAS as described above).

In summary, embodiments of the present invention are directed to new command and timing definitions for SDRAM-like architectures, which may enable better addressing capability than with existing SDRAM architectures. For example, some embodiments may be directed to new memory organization and address definitions, which may enable better addressing capability than with existing SDRAM architectures. In addition, other embodiments may be directed to configurable address extension methods (e.g., that may be enabled at memory chip initialization or power-on). These embodiments may support high capacity memory without increasing pin count or pin cost. These embodiments may also improve address pin reusability.

While certain embodiments of the present invention have been illustrated and described, it is understood by those of ordinary skill in the art that certain modifications and changes can be made to the described embodiments without departing from the spirit and scope of the present invention as defined by the following claims, and equivalents thereof.

What is claimed is:

1. A method for addressing data in a memory device, the data being arranged in an array of rows and columns respectively indexed by a first number of row address bits and a second number of column address bits, the data being addressed using an architecture defined by a row address command specifying a third number of row address bits and a column address command specifying a fourth number of column address bits, the first number being greater than the third number, the method comprising:
   splitting the first number of row address bits into a first subset of row address bits and a second subset of row address bits;
   specifying the first subset in the row address command and the second subset in a next address command; and
   processing the row address command as all or part of a row access command for accessing a row of the memory device.

2. The method of claim 1, wherein the next address command is a column address command.

3. The method of claim 2, further comprising processing the column address command immediately after the processing of the row address command.

4. The method of claim 1, further comprising issuing the next address command after the row address command and before the column address command.

5. The method of claim 4, wherein the issuing of the next address command immediately follows the issuing of the row address command.

6. The method of claim 1, wherein the data is further arranged in subarrays of the rows and the columns, each of the subarrays being a subset of the array and being respectively indexed by the third number of row address bits and the second number of column address bits, the first subset of row address bits being the third number of row address bits,
   wherein the memory device comprises a row buffer for each of the subarrays, and
   wherein the method further comprises, for each of the subarrays, loading a corresponding said row buffer with row data from the subarray as specified by a corresponding said first subset of row address bits in response to the row address command.

7. The method of claim 6, further comprising selecting one of the subarrays as specified by the second subset of row address bits in the next address command.

8. A method for addressing data in a memory device, the data being arranged in an array of rows and columns respectively indexed by a first number of row address bits and a second number of column address bits, the data being addressed using an architecture defined by a row address command specifying a third number of row address bits followed by a column address command specifying a fourth number of column address bits, the second number being greater than the fourth number, the method comprising:

splitting the second number of column address bits into a third subset of column address bits and a fourth subset of column address bits;

specifying the fourth subset in the column address command and the third subset in a previous address command when the second number is greater than the fourth number; and processing the column address command as all or part of a column access command corresponding to a row.

9. The method of claim 8, wherein the previous address command is the row address command.

10. The method of claim 9, further comprising processing the row address command immediately before the processing of the column address command.

11. The method of claim 9, wherein the data is further arranged in subarrays of the rows and columns, each of the subarrays being a subset of the rows and columns and respectively indexed by the first number of row address bits and the fourth number of column address bits, the fourth subset of column address bits being the fourth number of column address bits, wherein the memory device comprises a row buffer for each of the subarrays, and wherein the method further comprises, for each subarray of the subarrays, loading a corresponding said row buffer with row data from the subarray as specified by the first number of row address bits in response to the row address command.

12. The method of claim 11, further comprising selecting one of the subarrays as specified by the third subset of column address bits in the previous address command.

13. A memory device comprising:

storage cells for storing data arranged in an array of rows and columns respectively indexed by a first number of row address bits and a second number of column address bits, wherein the data in the memory device is addressed using an architecture defined by a row address command specifying a third number of row address bits followed by a column address command specifying a fourth number of column address bits, the first number being greater than the third number, and wherein the memory device is configured to address the data by:

splitting the first number of row address bits into a first subset of row address bits and a second subset of row address bits, and specifying the first subset in the row address command and the second subset in a next address command when the first number is greater than the third number; and processing the row address command as all or part of a row access of a row of the memory device.

14. The memory device of claim 13, wherein the next address command is a column address command.

15. The memory device of claim 14, wherein the memory device is further configured to address the data by processing the column address command immediately after processing the row address command.

16. The memory device of claim 13, wherein the addressing of the data further comprises processing the next address command after the row address command and before the column address command.

17. The memory device of claim 16, wherein the processing of the next address command immediately follows the processing of the row address command.

18. The memory device of claim 13, wherein the data is further arranged in subarrays of the rows and columns, each of the subarrays being a subset of the rows and columns and respectively indexed by the third number of row address bits and the second number of column address bits, the first subset of row address bits being the third number of row address bits, wherein the memory device further comprises a row buffer for each of the subarrays, and wherein the addressing of the data further comprises, for each subarray of the subarrays, loading a corresponding said row buffer with row data from the subarray as specified by a corresponding said first subset of row address bits in response to the row address command.

19. The memory device of claim 18, wherein the addressing of the data further comprises selecting one of the subarrays as specified by the second subset of row address bits in the next address command.

20. The memory device of claim 19, wherein the second number is greater than the fourth number, wherein the data is further arranged in subarrays of the rows and columns, each of the subarrays being a subset of the rows and columns and respectively indexed by the first number of row address bits and the fourth number of column address bits, wherein the memory device further comprises a row buffer for each of the subarrays, and wherein the addressing of the data further comprises, for each of the subarrays, loading a corresponding said row buffer with row data from the subarray as specified by the first number of row address bits in response to the row address command, and selecting one of the subarrays as specified by a third subset of column address bits in a previous address command.

* * * * *